(12) United States Patent
Song et al.

(10) Patent No.: US 11,073,633 B2
(45) Date of Patent: Jul. 27, 2021

(54) NMR ASIC

(71) Applicant: SCHLUMBERGER TECHNOLOGY CORPORATION, Sugar Land, TX (US)

(72) Inventors: Yi-Qiao Song, Newton Center, MA (US); Soumyajit Mandal, Cambridge, MA (US); Yiqiao Tang, Allston, MA (US); David McCowan, York, ME (US)

(73) Assignee: Schlumberger Technology Corporation, Sugar Land, TX (US)

( * ) Notice: Subject to any disclaimer, the term of this patent is extended or adjusted under 35 U.S.C. 154(b) by 350 days.

(21) Appl. No.: 15/506,759

(22) PCT Filed: Aug. 27, 2015

(86) PCT No.: PCT/US2015/047228
§ 371 (c)(1),
(2) Date: Feb. 27, 2017

(87) PCT Pub. No.: WO2016/033344
PCT Pub. Date: Mar. 3, 2016

(65) Prior Publication Data
US 2017/0248732 A1      Aug. 31, 2017

Related U.S. Application Data

(60) Provisional application No. 62/186,728, filed on Jun. 30, 2015, provisional application No. 62/042,609, filed on Aug. 27, 2014.

(51) Int. Cl.
*G01V 3/32* (2006.01)
*G01R 33/36* (2006.01)
(Continued)

(52) U.S. Cl.
CPC ........... *G01V 3/32* (2013.01); *G01R 33/3607* (2013.01); *G01R 33/3621* (2013.01);
(Continued)

(58) Field of Classification Search
None
See application file for complete search history.

(56) References Cited

U.S. PATENT DOCUMENTS 4,707,797 A    11/1987   Briggs
5,166,620 A    11/1992   Panosh
(Continued)

FOREIGN PATENT DOCUMENTS

WO      2009108326 A2    9/2009

OTHER PUBLICATIONS

Anders, J. et al., "An integrated CMOS Receiver Chip for NMR-Applications", Custom Integrated Circuits Conference, 2009, pp. 471-474.
(Continued)

*Primary Examiner* — Douglas X Rodriguez
(74) *Attorney, Agent, or Firm* — Trevor G. Grove

(57) ABSTRACT

An NMR system includes a radio frequency (RF) NMR application-specific integrated circuit (ASIC) chip configured to generate an RF output signal and a rectifier configured to receive the RF output signal and convert the RF output signal to (a) a direct current (DC) pulsed field gradient (PFG) signal or (b) a DC trigger signal for at least one of (i) activating at least one component of an NMR system external to the NMR RF ASIC chip and (ii) synchronizing at least one component of an NMR system external to the NMR RF ASIC chip.

14 Claims, 9 Drawing Sheets

(51) Int. Cl.
*G01R 33/385* (2006.01)
*G01R 33/54* (2006.01)
*G01N 24/08* (2006.01)
*G01R 19/32* (2006.01)

(52) U.S. Cl.
CPC ..... *G01R 33/3628* (2013.01); *G01R 33/3852* (2013.01); *G01R 33/543* (2013.01); *G01N 24/081* (2013.01); *G01R 19/32* (2013.01)

(56) References Cited

U.S. PATENT DOCUMENTS

| | | | |
|---|---|---|---|
| 5,796,252 A * | 8/1998 | Kleinberg | G01V 3/32 324/303 |
| 6,268,726 B1 * | 7/2001 | Prammer | G01N 24/081 324/300 |
| 8,988,076 B2 | 3/2015 | Mandal et al. | |
| 10,295,636 B2 | 5/2019 | Song et al. | |
| 2002/0033699 A1 * | 3/2002 | Toufaily | G01N 24/081 324/318 |
| 2010/0156413 A1 | 6/2010 | Chen et al. | |
| 2011/0091987 A1 | 4/2011 | Weissleder et al. | |
| 2011/0234220 A1 * | 9/2011 | Mitchell | G01N 24/081 324/303 |
| 2011/0248765 A1 | 10/2011 | Tumer et al. | |
| 2012/0025720 A1 * | 2/2012 | Chen | H02M 3/337 315/185 R |
| 2013/0099590 A1 * | 4/2013 | Ma | H02M 3/3388 307/104 |

OTHER PUBLICATIONS

Hassibi, A. et al., "A Spectral-Scanning Nuclear Magnetic Resonance Imaging (MRI) Transceiver", IEEE Journal of Solid-State Circuits, 2009, 44(6), pp. 1805-1813.

Makhonin, M. N. et al., "Fast control of nuclear spin polarization in an optically pumped single quantum dot", Nature Materials, 2011, pp. 844-848.

Song, Y.-Q. et al., "Reduction of Spin Polarization near Landau Filling Factor v=3 in GaAs/AlGaAs Quantum Wells", Physical Review Letters, 1999, 82(13), pp. 2768-2771.

Sun, N. et al., "CMOS RF Biosensor Utilizing Nuclear Magnetic Resonance", IEEE Journal of Solid-State Circuits, 2009, 44(5), pp. 1629-1643.

Sun, N. et al., "Palm NMR and 1-Chip NMR", IEEE Journal of Solid-State Circuits, 2011, 46(1), pp. 342-352.

Tycko, R. et al., Electronic States in Gallium Arsenide Quantum Wells Probed by Optically Pumped NMR, Science, 1995, 268(5216), pp. 1460-1463.

Tycko, R. et al., "Optical Pumping in Solid State Nuclear Magnetic Resonance", Journal of Physical Chemistry, 1996, 100(31), pp. 13240-13250.

Anders, J. et al., "A fully integrated IQ-receiver for NMR microscopy", Journal of Magnetic Resonance, 2009, 209(1), pp. 1-7.

* cited by examiner

NMR ASIC

CROSS-REFERENCE TO RELATED APPLICATIONS

This application claims priority to U.S. Provisional Patent Application Ser. No. 62/042,609, filed on Aug. 27, 2014 and which is incorporated herein by reference in its entirety, and U.S. Provisional Patent Application Ser. No. 62/186,728, filed on Jun. 30, 2015 and which is incorporated herein by reference in its entirety.

TECHNICAL FIELD

This disclosure relates to nuclear magnetic resonance (NMR) and control thereof. Some examples relate more specifically to NMR measurements taken in the field or in a laboratory. Such measurements may include, for example, downhole measurements using NMR well-logging tools, including, for example, wireline and logging-while-drilling (LWD) tools.

BACKGROUND

Nuclear Magnetic Resonance (NMR) is a routinely used technique for reservoir characterization due to its capability of measuring the hydrogen nuclei in the reservoir fluids. As both water and hydrocarbons like oil and gas contain hydrogen nuclei, they can be measured and quantified by NMR tools. Furthermore NMR measurement of relaxation times (T1 and T2) and diffusion coefficients enable understanding of the dynamics of these fluids, resulting in the interpretation of their physical state (i.e. free or bound), the sizes of the pores they are confined in, the viscosity and type of hydrocarbons and the permeability of the rock system.

Diffusion is typically measured by the application of pulse sequences in combination with magnetic field gradients. Both static gradient produced by the magnet itself or pulsed gradient produced by running electrical current in coils have been used. The pulsed field gradient (PFG) method can be beneficial due to its better SNR. In particular for small samples, the PFG coils can be also very small and highly efficient to produce large field gradient with minimal power. This is very useful for, e.g., miniaturized NMR systems.

Pulsed field gradient (PFG) capability is utilized in performing diffusion experiments and many spectroscopy experiments. The electrical current pulses generated by the PFG unit (which could be a part of the NMR ASIC of some example embodiments of the present application) will be sent to the coils in the NMR probe to produce magnetic field gradients. For example, for diffusion measurements, typically two gradient pulses δ of equal amplitude and duration are used to produce signal decay due to diffusion, as shown in FIG. 1. FIG. 1 shows an example of a pulsed-gradient spin echo (PGSE) pulse sequence used for diffusion measurements. The upper line 101 depicts the sequence of the RF pulses, and the lower line 102 depicts the sequence of the pulsed field gradient. The amount of decay is then used to obtain the diffusion coefficient of a pure fluid or a distribution of diffusion coefficients of a complex fluid that contains a range of molecules.

In addition, NMR experiments are often performed together with other devices (which may provide electrical, magnetic field, or optical pulses to the sample). For example, laser light excitation could be applied to the sample before or during the NMR pulse sequences in order to perform optically-detected NMR (see "Fast control of nuclear spin polarization in an optically pumped single quantum dot", M. N. Makhonin, K. V. Kavokin, P. Senellart, A. Lemaître, A. J. Ramsay, M. S. Skolnick, and A. I. Tartakovskii, Nature Materials 10, 844-848 (2011) doi:10.1038/nmat3102) or laser-enhanced NMR (see "Reduction of spin polarization near Landau filling factor ν=3 in GaAs/AlGaAs quantum wells", Y.-Q. Song, B. M. Goodson, K. Maranowski, A. C. Gossard, Physical Review Letters 82, 2768-2771 (1999) and "Optical pumping in solid state nuclear magnetic resonance", R. Tycko and J. A. Reimer, J. Phys. Chem. 100, 13240-13250 (1996)). Synchronization of these devices requires either input or output digital or analog signals from the NMR ASIC to the external devices.

An example of an application for an external trigger is shown in connection with FIGS. 2A, 2B, and 2C (reproduced from Tycko, R., Barrett, S. E., Dabbagh, G., Pfeiffer, L. N., & West, K. W. (1995). Electronic states in gallium arsenide quantum wells probed by optically pumped NMR. Science (New York, N.Y.), 268(5216), 1460-1463. doi: 10.1126/science. 7539550). An optical pumping NMR system typically includes a laser and a conventional NMR system. The sample can be irradiated by the laser. The laser can be turned on and off using an electrical trigger signal. This signal can be used to shut down the power to the laser or it controls a shutter. The timing diagram of FIG. 2A shows the sequence of the experiment, which includes first executing a few RF pulses 201 to initialize the magnetization, then turning the laser on using the external trigger function, then turning off the laser, then executing the main NMR pulse sequence 202 to obtain data.

Although there are existing implementations of NMR application-specific integrated circuits (NMR ASICs), such NMR ASICs have limited functionality and are RF only.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

As indicated above, existing NMR ASICs have limited functionality and are RF only. In contrast to such RF NMR ASICs, some example embodiments of the present invention provide Full NMR ASICS, which are not limited to RF.

Some examples provide an NMR application-specific integrated circuit that includes: an on-chip pulse sequence generator configured to generate radio-frequency NMR pulse sequences; an on-chip radio-frequency transmitter configured to transmit the radio-frequency NMR pulse sequences generated by the on-chip pulse sequence generator; an on-chip radio-frequency receiver configured to receive radio-frequency signals corresponding to an excitation period of the NMR pulse sequences generated by the on-chip pulse sequence generator; and at least one of (a) an on-chip pulse field gradient unit configured to generate pulses defining a pulsed field gradient, (b) an on-chip external trigger configured to provide trigger signals that can be sent to an external device, (c) an on-chip external input configured to receive input from a device external to the NMR application-specific integrated circuit, and (d) an on-chip configuration memory configured to store values of the configuration of the NMR application-specific integrated circuit.

Some examples provide an NMR application-specific integrated circuit that includes: an on-chip pulse field gradient unit configured to generate pulses defining a pulse field gradient; at least one of (a) an on-chip external trigger configured to provide trigger signals that can be sent to an external device and (b) an on-chip external input configured to receive input from a device external to the NMR application-specific integrated circuit; and an on-chip configuration memory configured to store values of the configuration of the NMR application-specific integrated circuit. Some examples provide a method that includes performing an NMR analysis using the NMR application-specific integrated circuit.

Some examples provide a method that includes generating a radio frequency (RF) signal using an NMR RF application-specific integrated circuit (ASIC) chip; and converting the RF signal into a direct current (DC) pulsed field gradient (PFG).

Some examples provide a method that includes generating a radio frequency (RF) signal using an NMR RF application-specific integrated circuit (ASIC) chip, converting the RF signal to a direct current (DC) trigger pulse; and at least one of (a) activating at least one component of an NMR system external to the NMR RF ASIC chip and (b) synchronizing at least one component of an NMR system external to the NMR RF ASIC chip.

Some examples provide a system that includes a radio frequency (RF) NMR radio application-specific integrated circuit (ASIC) chip configured to generate an RF output signal, and a rectifier configured to receive the RF output signal and convert the RF output signal to (a) a direct current (DC) pulsed field gradient (PFG) signal or (b) a DC trigger signal for at least one of (i) activating at least one component of an NMR system external to the NMR RF ASIC chip and (ii) synchronizing at least one component of an NMR system external to the NMR RF ASIC chip.

Further features and aspects of example embodiments of the present invention are described in more detail below with reference to the appended Figures.

DETAILED DESCRIPTION

A highly application-specific integrated circuit (ASIC) in accordance with example embodiments performs many functions that are integral for an NMR system. For example, example NMR ASICs contain the arbitrary pulse generator, transmitter and receiver, the three essential components of an NMR spectrometer. The transmitter produces RF pulses (typically with the frequency of many MHz) with specific duration and amplitude and phases and is used to excite the NMR signal. The precise timing of the pulses is achieved by the internal clock circuit.

Known ASICs are not capable of producing DC voltage or current pulses and pulse sequences to satisfy the need of producing DC pulses with precise timing and amplitude for the PFG applications. This description provides, inter alia, methods and devices for using NMR RF ASIC to produce DC pulses of precise timing and amplitude for the application of PFG for diffusion measurement.

Figure 6:
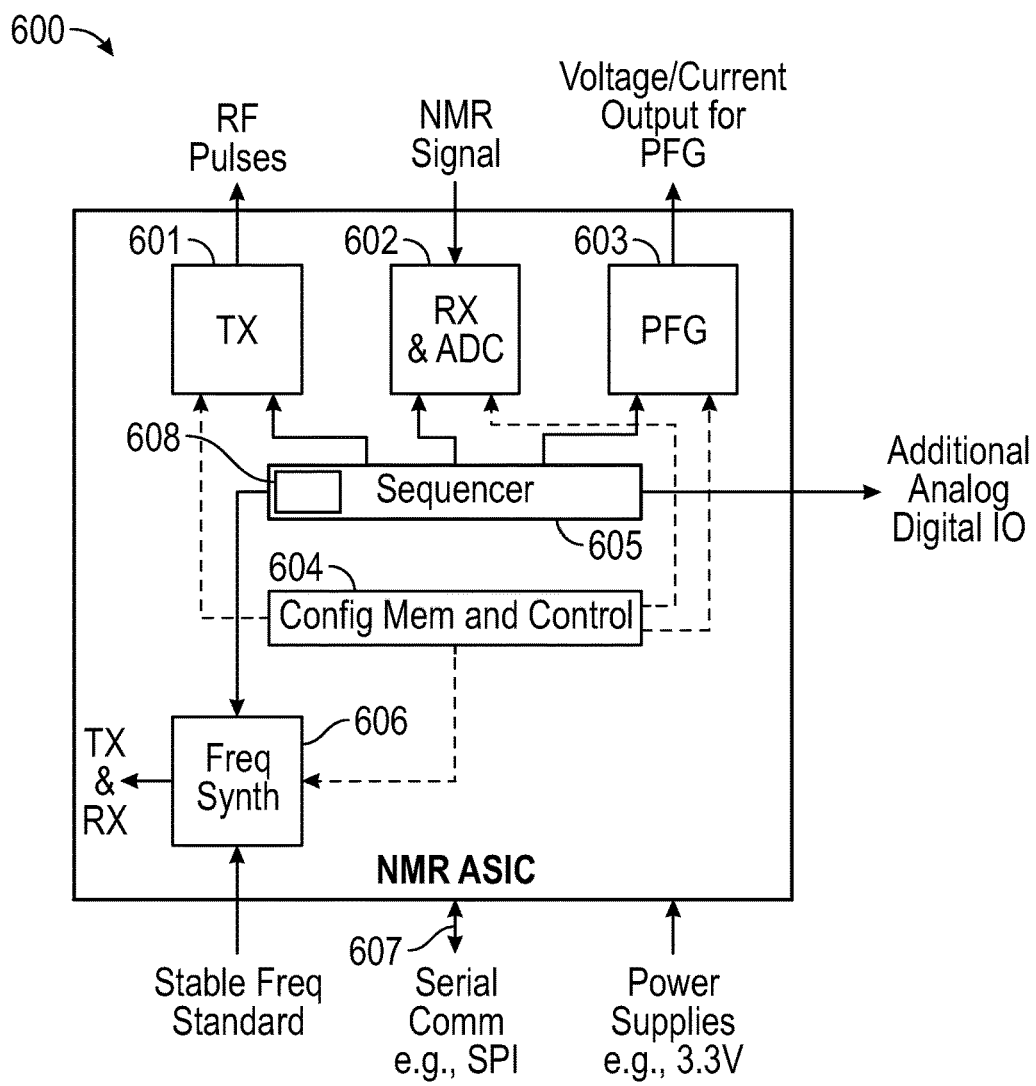
FIG. 6 shows a block diagram of an example NMR ASIC.

An NMR ASIC is quite complex and contains many parts for different functionalities. The overall architecture of an example NMR ASIC 600 is illustrated in FIG. 6 and described in further detail below. The interconnections between different parts are illustrated with lines and arrows.

This ASIC 600 will operate together with several other components/chips, including, for example, power supplies and a stable frequency source (e.g. a crystal oscillator). These other components may also include a microcontroller that provides the ASIC with the pulse sequence codes and also transfers the acquired data. Examples of such microcontrollers include the PIC32MX family of CPUs by Microchip Technology Inc., the SM320F28335-HT from Texas Instruments, and the HT83C51 from Honeywell.

These microcontrollers typically have SPI interfaces (ports) to allow high-speed communication with other SPI devices. The data from the NMR ASIC 600 would be transferred to the microcontroller via one of these SPI ports for further processing. The microcontroller also hosts the pulse sequence data to be transferred into the NMR ASIC 600 in order to be executed. Because of the capabilities of the microcontroller and its memory, a large range of pulse sequences can be implemented. In addition, the microcontroller can address other external memory modules, such as flash memory that may contain additional pulse sequence data. The microcontroller can also use SPI or other digital interfaces to communicate and control other devices to perform peripheral measurements, such as environmental temperature, pressure, magnetic field, battery condition, etc.

The existing NMR ASICs, however, do not have all the functionalities as illustrated in FIG. 6. They only contain a transmitter, receiver, and sequencer, or a subset of these three components. The on-chip PFG controller 603 is not believed to be in any prior NMR ASIC. Example implementations of the present application provide that the RF pulse output can be used to produce DC pulses with precision timing to be used as PFG. Since the sequencers are designed to output RF pulses with precise timing (both the duration of the pulses and the time within the sequence), the resulting DC pulses will exhibit the same precision as the RF pulses.

In accordance with some example embodiments, a chip, which may be an application-specific integrated circuit (ASIC) chip, may include one or more of the following structures: a pulse sequence generator, an RF transmitter (TX), a receiver (RX), an analog-to-digital converter (ADC) for the receiver, a pulse field gradient (PFG) unit, output triggers, input triggers, and configuration memory. Referring, for example, to FIG. 6, an NMR ASIC chip 600 includes a TX 601, an RX and ADC unit 602, and PFG unit 603, a configuration memory and control unit 604, and a sequencer 605. In some examples the triggers may be incorporated into the PFG unit 603, while in some examples the triggers are provided as one or more separate unites on the chip 600.

The on-chip pulse sequence generator, i.e., pulse sequencer, 605 provides essentially arbitrary pulse sequences. The pulse sequence generator may be configured to provide any suitable number of pulse sequences. The pulse sequencer and the TX cooperate to generate RF signals in accordance with user-defined parameter data stored in the memory (such as the on-chip memory 604), and such RF signals may be supplied to an external antenna for emitting excitation signals from the external antenna during the excitation period of the NMR pulse sequence. The RX receives electrical signals generated by an external antenna during the acquisition period of the NMR pulse sequence.

The on-chip TX is configured to provide amplitude and phase control for the RF pulses. Some examples provide 5-bit amplitude and phase control to provide 32 different amplitudes and phases for the RF pulses. It should be understood, however, that any suitable amplitude and phase control may be provided.

The on-chip RX may be, for example, an analog receiver which may provide two channels (I and Q) after demodulation.

The on-chip ADC may be provided for both I and Q channels within the ASIC to simplify the signal detection and remove the analog output from the chip altogether. It should be understood, however, that other examples may maintain analog output in addition to or as an alternative to the digital output.

The on-chip PFG unit may include a PFG circuit configured to generate digitally-programmable unipolar or bipolar field gradient pulses that can be used for diffusion measurements. In some examples, these pulses are generated by using an analog feedback loop to sense and control the current flowing through an off-chip gradient coil. Different gradient coils can be used to generate field gradients in different directions, such as, for example, the x, y, and z axes.

The on-chip output triggers are configured to provide trigger signals that can be sent to external devices to, for example, initiate the operation of the device, terminate operation of the device, and/or initiate a particular pulse sequence of the device. These are typically digital signals, although analog outputs can be used as an alternative or in combination with the digital signals. Multiple output triggers may be combined to form a multi-bit signal, for example, to apply to a DAC (Digital-Analog Converter) to generate an analog voltage signal whose output voltage is fully controlled by the NMR ASIC. This analog signal, for example, could be used to drive an external PFG unit (for example, external to the one within the ASIC 600).

The input triggers are inputs from external devices to the NMR ASIC. These signals can be either digital or analog. These signals are typically read by the pulse sequencer and may cause the NMR ASIC to continue a pulse sequence, pause the sequence, or terminate the sequence.

The on-chip configuration memory 604 is provided and configured to store the values of the ASIC configuration, such as receiver gain, receiver LO phase, tuning and matching condition, etc.

More detailed descriptions of example designs and circuits of the NMR ASIC are provided, for example, below.

On-Chip ADC for Receiver

On-chip buffer memory (such as SRAM) may be provided to temporarily hold the digitized data until it can be read by an external micro-controller. The memory may be connected to an SPI bus (or other digital bus) in order to be read by the micro-controller.

The amount of memory for a particular application may be estimated. Typical NMR data is acquired every 5 µs or slower, and each acquired data point is made of two real numbers. Each of these numbers may contain, in some examples, 8-16 bits, and is typically converted within 1 µs by the ADC. Thus the data rate is approximately 3-6 Mbits per second maximum in such examples. An SPI bus of 5-10 MHz will have no problem to read the data off the NMR ASIC. Thus, a small buffer of 40-100 bytes would be sufficient for data transfer in such non-limiting examples.

PFG Circuit

In accordance with some example implementations, the goal of the PFG circuit is to apply and control pulsed magnetic field gradients, which are proportional to currents flowing through one or more gradient coils. However, analog signal processing, both in ASICs and in board-level designs, is generally performed using voltages, not currents. As a result, PFG circuits often use a series resistor to convert the coil current into a proportional voltage drop. A voltage-based negative feedback loop is then used to regulate the coil current to its desired value. This loop may be designed and configured to remain stable and well-behaved over all possible changes in coil inductance, operating temperature, output current level, and other system parameters. Sensing and regulating the load current (instead of the load voltage) simplifies the dynamics of the system by eliminating the load impedance from the feedback loop. The same advantage underlies the recent popularity of current-mode control for DC/DC converters. It should be appreciated, however, that other example implementations may nevertheless utilize sensing and regulation via load voltage.

Figure 1:
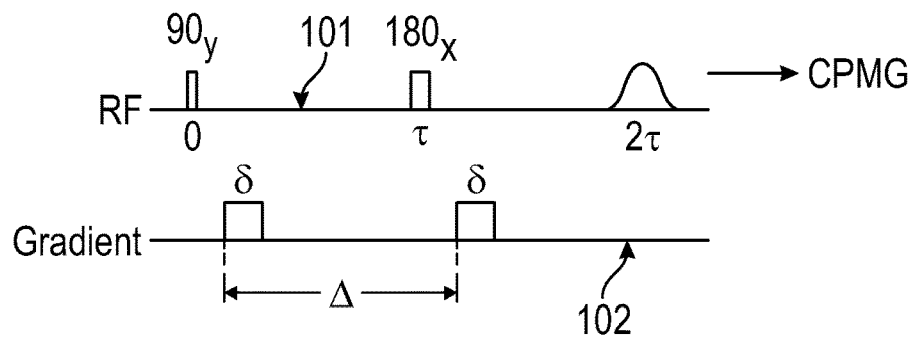
FIG. 1 shows a pulsed-gradient spin echo (PGSE) pulse sequence used for NMR diffusion measurements.
Figure 2A:
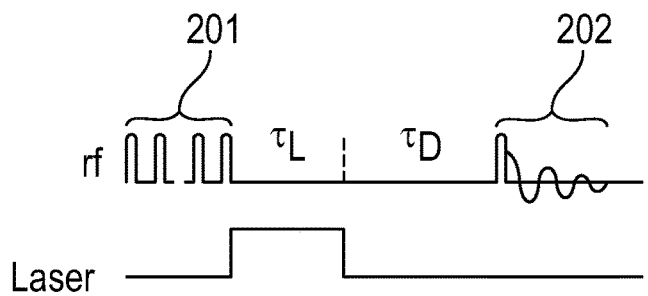
FIG. 2A shows a timing diagram for optically pumped NMR measurements.
Figure 2B:
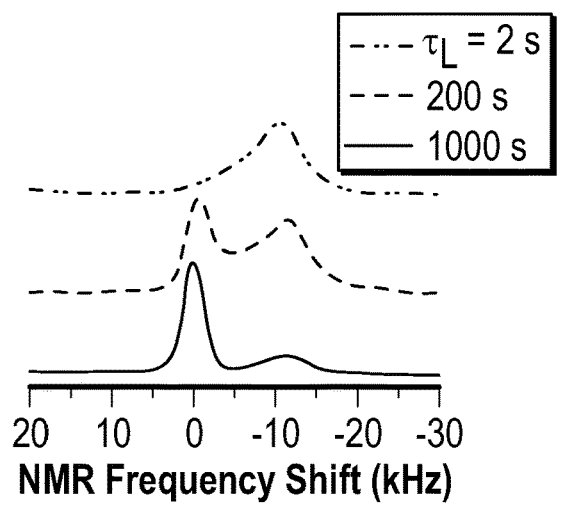
FIG. 2B shows the $^7$ $^1$Ga NMR spectra at 1.9 K, 7.05 T, and v=0.88 (θ=0°) with $\tau_D$=1 s and indicated values of $\tau_L$(200-mW light).
Figure 2C:
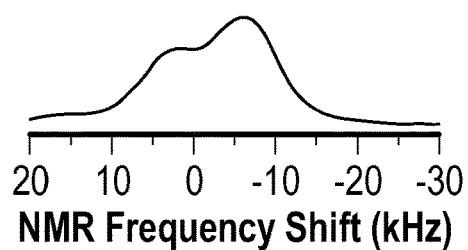
FIG. 2C shows spectrum obtained with $\tau_L$=2 s and with the laser shutter open during acquisition of the NMR signals, illustrating light-induced shift and signal broadening from nuclei in GaAs wells.
Figure 3:
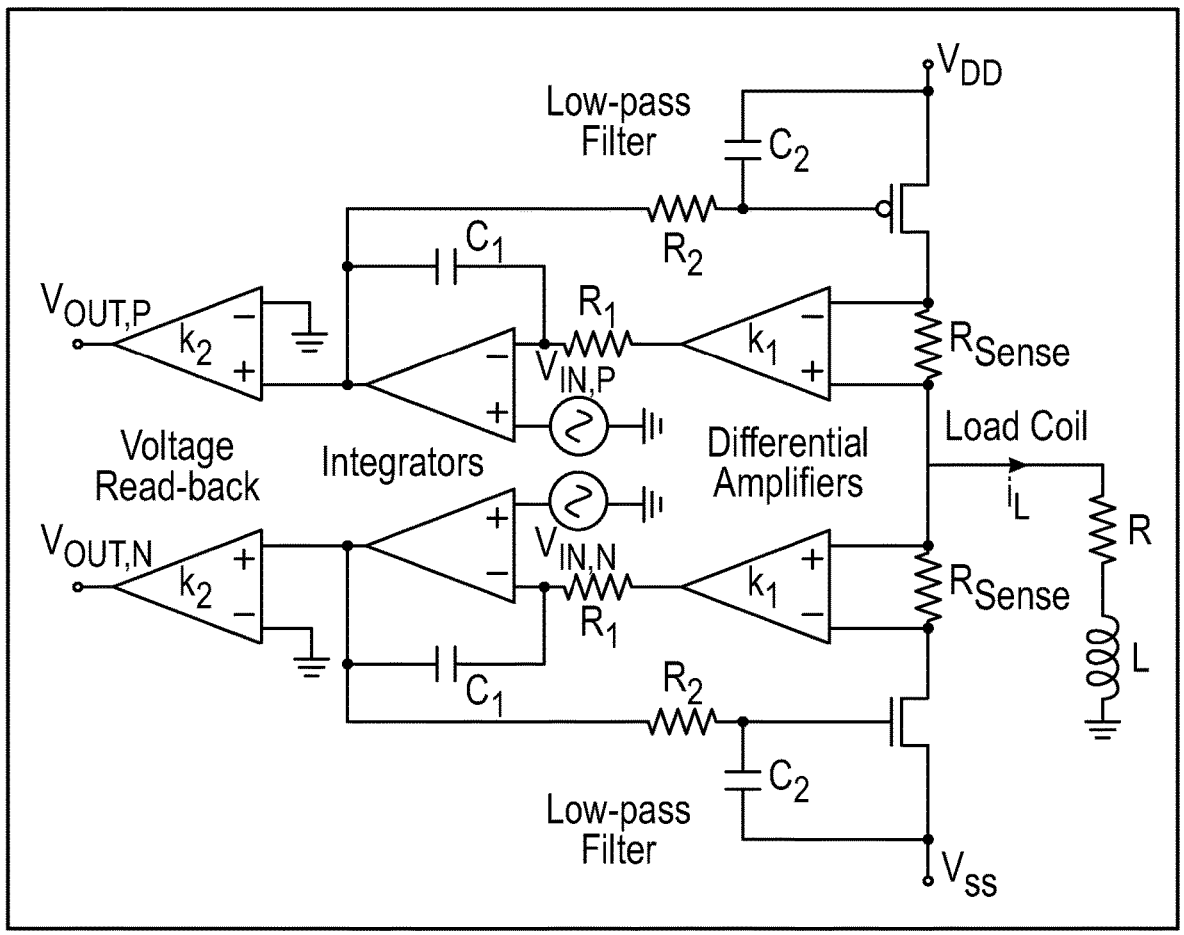
FIG. 3 shows a simplified schematic of a gradient driver circuit in accordance with example embodiments of the present invention.

In accordance with example implementations, a gradient driver circuit 300 in accordance with FIG. 3 is provided. This arrangement is described in further detail in this description.

External Outputs

The pulse sequencer may be provided with bits to control the corresponding logic outputs. When the pulse code is loaded, the corresponding bits will be set (e.g. logic 1 or 0 correspond to voltage low or high). The output of these bits is connected, possibly via driver circuits, to the external pins. These pins are further connected to the intended other circuits/devices external to the NMR ASIC.

External Inputs

There may be some inputs from external pins into the chip. For illustration, one pin may be called $P_{in}$. The logic of this $P_{in}$ could be either 1 or 0, corresponding to low or high voltage.

One bit, called $P_c$, in the pulse code may be dedicated to this function, When the sequencer arrives at this code, it may examine the value of $P_c$. If it is set to 1, then the sequencer checks $P_{in}$. If $P_{in}=1$, then the sequence proceeds. If $P_{in}=0$, then the sequencer pauses the sequence. If $P_c=0$, then the sequencer ignores $P_{in}$ and continues to execute the sequence.

Tuning: Analog and Digital

Analog Tuning

Figure 4:
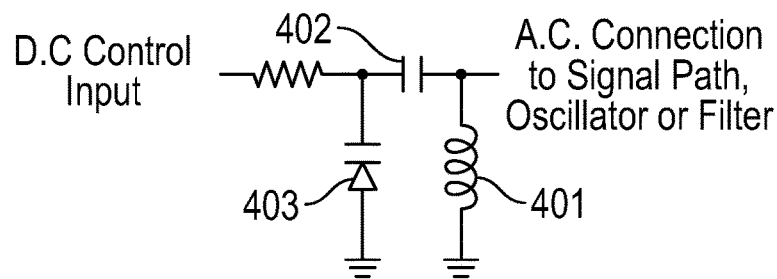
FIG. 4 shows an example tunable resonant circuit using a varactor.

Referring, for example, to FIG. 4, The RF probe in NMR may use a resonant tuning circuit 400, such as a parallel resonance formed by an inductor 401 (the coil, inductance L) and a capacitor 402 (capacitance C). The resonance frequency of such circuit is $$f = \frac{1}{2\pi\sqrt{LC}}.$$

Consider an NMR tool with a proton resonance frequency of 1 MHz. In this case we can use a coil of L=10 μH, and a tuning capacitor of C=16 nF. In order to use the same coil for sodium (Na) NMR, the capacitance is increased by a factor of about 16, i.e., C(Na)=260 nF. Another way to assemble a RF probe for Na is to increase the inductance of the coil, for example to L(Na)=40 μH, and the capacitance will then be 64 nF.

In practical applications the value of the tuning capacitor often has to be adjusted by a few percent during tool operation in order to account for changes in the Larmor frequency, coil inductance, etc. Variable tuning capacitors are needed for this purpose. For low power NMR systems, such as for very small coils, the voltage applied to the coil is low, e.g. 10-30 V. In such system, PIN diodes can be used as RF switches and varactors (also named varicaps) can be used as the variable tuning and matching capacitors. A typical circuit that uses varactor tuning is shown in FIG. 4.

Referring to FIG. 4, the diode 403 with an extra bar is the symbol for a varactor. A DC voltage needs to be applied across the varactor 403 in order to change/control its capacitance. Additional conventional capacitors (such as ceramic capacitors) can be added in parallel to the coil in order to vary the tuning range. As can be seen in FIG. 4, a precision analog voltage is utilized to adjust the tuning and matching. This voltage can be applied from the ASIC as an analog voltage output. In some example implementations, however, the output trigger lines from the ASIC are used to form an analog voltage using an external DAC on the circuit board. The control value of such analog voltage can be stored on the ASIC.

Digital Tuning

When the NMR system needs high power (such as a few kW), the use of varactor may not be appropriate in some circumstances. Such systems often use some forms of switches 503 (e.g., electromechanical and/or solid state switches) to select the connection to a bank of ceramic capacitors 502 in order to vary the tuning or matching capacitors 504, as illustrated in FIG. 5.

Figure 5:
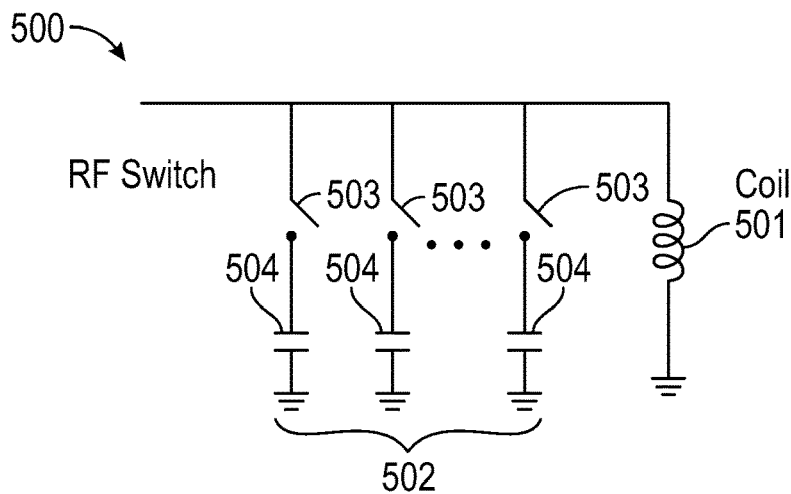
FIG. 5 shows an example tunable resonant circuit using a digitally-controlled capacitor bank.

Referring to the tunable resonant circuit 500 of FIG. 5, which includes inductor 501, each RF switch 503 is controlled by a driver circuit. The driver circuit is controlled by an output line from the ASIC. Thus, a few output lines from the ASIC can precisely adjust the total capacitance of the tuning circuit. One example is given below.

It may be assumed that the tuning capacitors 504 are $C_0$, $C_1$, ..., $C_7$, and that $C_1=C_0*2$, $C_2=C_1*2$, ..., $C_7=C_6*2$. Eight control lines form a binary number p, where $p_0$, $p_1$, $p_2$, etc. are the digits. The total capacitance is then given by $$C_T = \sum_{i=0}^{7} p_i * C_i,$$

and thus $$C_T = pC_0.$$

Here p is the binary value with the digits, $p=[p_7\ p_6\ p_5\ p_4\ p_3\ p_2\ p_1\ p_0]$, and p=0-255 in this example. As a result, the capacitance value can span the range of $(1-255)C_0$. For example, if p=00001111, then the capacitance will be [1111] (binary)=15 (decimal), thus $C_T=15C_0$. If we add another fixed capacitor $C_f$ in parallel with $C_T$, the full tuning capacitor will be $$C_T=(1-255)C_0+C_f.$$

Thus the capacitance controlled by the switches ($C_T$) will determine the frequency range over which the resonant circuit can be tuned. The number of digits can be further increased to increase the tuning range.

The tuning value (digital code p) can be stored inside the NMR ASIC 600 since this value typically does not change during a single NMR experiment.

Configuration Memory

The NMR ASIC contains local memory in order to store the pulse sequence parameters. These parameters are organized into a series of pulse codes, where each code defines an RF pulse, time delay, and acquisition parameters. The local memory is dedicated to the pulse sequence parameters as these parameters (such as pulse lengths and phases) change constantly during one pulse sequence. On the other hand, some of the parameters controlling the performance of the ASIC do not change during a pulse sequence, such as receiver gain and tuning parameters, and they may be substantially the same for several pulse sequences. These parameters then can, in accordance with some examples, be stored in a separate "configuration" memory that is not tied to the pulse sequences.

The configuration memory can also be used to store loop numbers, as described in greater detail below. If a frequency synthesizer is implemented, the value of the frequency can also be stored in the configuration memory. Such memory can be made using SRAM (Static Random Access Memory).

Variable Frequency Synthesizer

NMR measurements are usually performed at the Larmor frequency of the spin under investigation. This frequency is proportional to the strength of the applied magnetic field, $$f_L=\gamma B_0$$

where $B_0$ is the magnetic field and γ is a constant known as the gyromagnetic ratio. Different nuclei have different values of γ, so the Larmor frequency is different for different nuclei at the same magnetic field. In addition, the magnetic field within the sample region may be inhomogeneous, i.e., can vary with position, as is the case with NMR well-logging tools. In this case, different frequencies correspond to different regions within the sample volume. As a result, varying the NMR operating frequency allows the detection of different areas of the sample. This process, which is often known as depth profiling or radial profiling, is similar in principle to magnetic resonance imaging (MRI). Thus there is often a need to adjust the operating frequency of the NMR ASIC.

External frequency synthesizers can be used for this purpose. Some such synthesizers may employ a phase-locked loop (PLL) with a fractional-N divider in order to generate a large range of frequencies.

An optional frequency synthesizer circuit 606 can also be integrated into the NMR ASIC 600. Similar PLL circuits have been integrated into an ASIC within an existing SLB tool, the Nonconductive-Mud Geological Imager (NGI).

All of the frequency synthesizers, either from a separate chip or integrated within the NMR ASIC, utilize a stable frequency reference to operate. This reference source may be, for example, a quartz crystal oscillator or a MEMS oscillator.

Pulse Sequencer Support of Features

In some example embodiments, the pulse sequence includes a series of pulse codes. Each pulse code specifies the following aspects of the pulse:

RF pulse duration.
RF pulse phase.
RF pulse amplitude.
The length of the time delay after the pulse.
An acquisition bit, to indicate whether to turn on signal acquisition or not.
A loop-start bit and a loop-end bit to control the looping of a portion of the sequence.
Positive and negative PFG amplitudes during the delay period, 10 bits each (the duration of the PFG pulses is determined by the delay time). The range of the bit size may be, for example, 5-12.
Additional digital outputs (e.g. 10 bits).
Additional digital inputs (e.g. 2 bits).

An amount of on-chip memory is utilized to define each pulse code. The memory may allow for, as an example, 256 different 96-bit pulse codes, i.e., 256×96=24 kB of memory.

The chip may contain loop-start and loop-end bits in order to execute a looping structure in a part of the pulse sequence. This allows for executing repetitive pulse sequences such as the CPMG.

In some example implementations, the NMR ASIC 600 includes a loop counter variable in the configuration memory 604. This variable is used to signal the termination of the loop. Such a loop counter can be implemented in accordance with the following non-limiting example.

As part of the pulse sequence, a loop number is loaded into the configuration memory 604, e.g., a loop number of 100. That means the loop should be executed 100 times and then the pulse sequence, via sequencer 605, should exit the loop and continue to finish the remainder of the pulse sequence. At the beginning of the loop, the loop number is loaded into a memory called, as an example, loop counter. The value of the loop counter will decrease by 1 every time the loop-start is executed. At the loop-end pulse code, the sequencer will examine whether the loop counter is zero. If it is zero, then it exits the loop in order to finish the remainder of the sequence; otherwise, it continues back to loop-start.

The pulse sequence will be terminated if the next pulse code is zero or if it reaches the end of the sequence memory. The pulse sequence can also be terminated by the chip shutdown command. This structure can certainly be extended to have multiple loops and multiple loop numbers.

Known systems that utilize a loop structure can only run the loop as the last part of the sequence. By including a loop counter, example embodiments of the present invention are not confined to this limitation.

Overall Architecture of the NMR ASIC

The overall architecture of the NMR ASIC is illustrated in FIG. 6. The major components are discussed, for example, above. The interconnections between different parts are illustrated with lines and arrows.

This ASIC 600 operates together with several other components/chips. It interfaces with power supplies, and a stable frequency source (e.g. a crystal oscillator). It also interfaces a microcontroller that provides it with the pulse sequence codes, configuration setting, and also transfers the acquired data. Examples of such microcontrollers are the PIC32MX family of CPUs by Microchip Technology Inc., the SM320F28335-HT from Texas Instruments, and the HT83C51 from Honeywell.

These microcontrollers typically have SPI interfaces (ports) to allow high-speed communication with other SPI devices. The data from the NMR ASIC may be transferred to the microcontroller via one of these SPI ports for further processing. The microcontroller also hosts the pulse sequence data to be transferred into the NMR ASIC in order to be executed. Because of the capabilities of the microcontroller and its memory, a large range of pulse sequences can be implemented. In addition, the microcontroller can address other external memory modules, such as flash memory that may contain additional pulse sequence data. The microcontroller can also use SPI or other digital interfaces to communicate and control other devices to perform peripheral measurements, such as environmental temperature, pressure, magnetic field, battery condition, etc.

As illustrated in FIG. 6, the microcontroller communicates with the NMR ASIC via an SPI interface 607. Through this interface 607, the pulse sequence data can be loaded into the sequencer 605, and configuration data can be loaded into the configuration memory 604 (to set the operating frequency, tuning, receiver gain, etc.). It should be understood that other digital interfaces, such as CAN or I$^2$C, can also be used for this purpose instead of SPI.

The full NMR ASIC 600 may have a shut-down pin, that when activated turns off the entire chip 600 to lower the power consumption. This pin will be controlled by the microcontroller.

As part of the SPI interface of the NMR ASIC 600, a SPI address decoder may be used to determine the target of the SPI data, i.e., whether it will be delivered to the sequence memory 608 or to the configuration memory 604. In some implementations, the sequence and configuration memory blocks can communicate via separate SPI interfaces. This is feasible since modern microcontrollers may contain, as a non-limiting example, multiple (e.g., 5 or more) SPI ports.

Converting an RF Pulse to a DC Pulse

In some examples, the conversion of an oscillating voltage or current signal to a DC signal may be performed by a device called a rectifier. In some examples, the rectifier is provided as a component separate from the NMR ASIC 600. In some examples, the rectifier is provided as an integrated component of the NMR ASIC.

The use of a rectifier to convert an oscillating voltage or current signal to a DC signal allows, in some examples, the use of known NMR ASIC chips, which do not have PFG capability, to be implemented in a PFG-capable NMR circuit. In some examples, the non-PFG NMR ASIC chip is implemented together with a rectifier arrangement as described herein in order to provide PFG capability.

Figure 7:
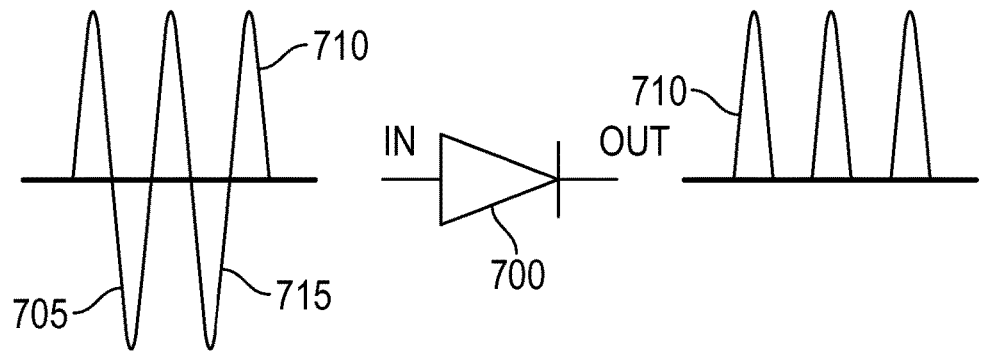
FIG. 7 shows a diode and input and output signals.

Referring to FIG. 7, the simplest form of rectifier is a diode 700 which only allows current to flow through the diode 700 in one direction.

FIG. 7 shows a simple circuit for rectification, with the input of an AC current 705 on the left-hand side (IN) of the diode 700 (anode) and the signal appearing on the right-hand side (OUT) with only positive lobes 710. Since a diode only allows current to flow from anode to cathode, the positive current lobes 710 will flow though and the negative currently lobes 715 will not, resulting in the output waveform with only positive lobes 710. The average of the current over the length of the pulse is now positive, thus a DC component of the current is realized.

Figure 8A:
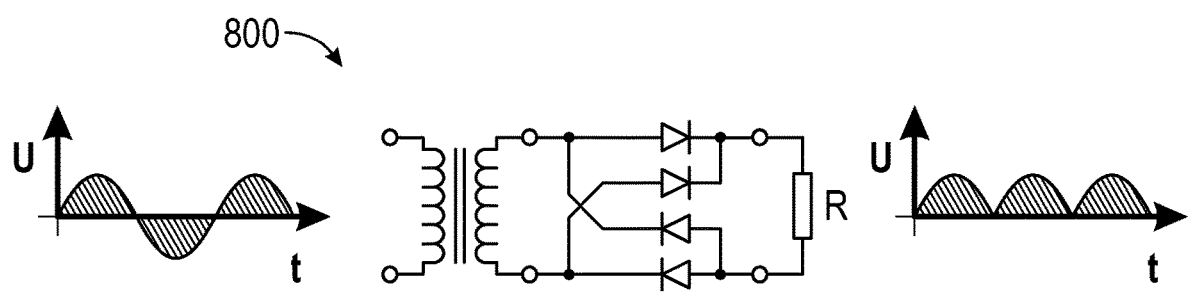
FIG. 8A shows a Gaetz bridge rectifier circuit (having a full-wave rectifier using four diodes) and input and output signals thereof.
Figure 8B:
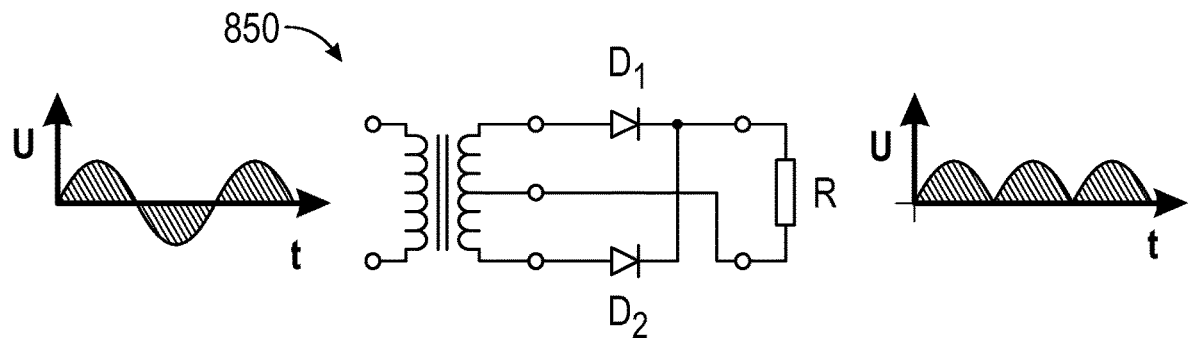
FIG. 8B shows a full-wave rectifier using a center tap transformer and two diodes, and input and output signals thereof.

Referring, for example, to FIGS. 8A and 8B, other examples are Graetz bridge 800 (full-wave rectifier using four diodes) and a full-wave rectifier 850. These types of rectifiers effectively use both negative and positive voltage supply, improving the operating efficiency. In Graetz bridge configuration, MOSFETS may be used instead of diodes, avoiding voltage drop and therefore increasing the output dynamic range.

Figure 9:
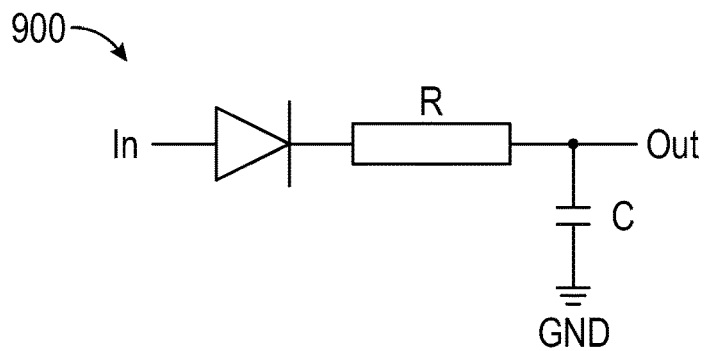
FIG. 9 shows a simple practical circuit for producing DC pulses from RF pulses, where R and C are a resistor and a capacitor, respectively.

The oscillatory part of the current can be filtered out by including a filter circuit at the output, such as a RC filter. A practical filter circuit 900 is shown in FIG. 9. Since the AC waveform is at the RF frequency, $f_0$, the RF component in the output waveform is primarily $f_0$, $2f_0$, and higher harmonics. Such harmonics can be removed by application of low-pass filters that only allows low frequency signal to pass through.

The output of a signal of frequency f may be analyzed for this circuit:

$$\left|\frac{V_0}{V_{in}}\right| = \left[\frac{1}{1 + (2\pi fRC)^2}\right]^{1/2}$$

Figure 10:
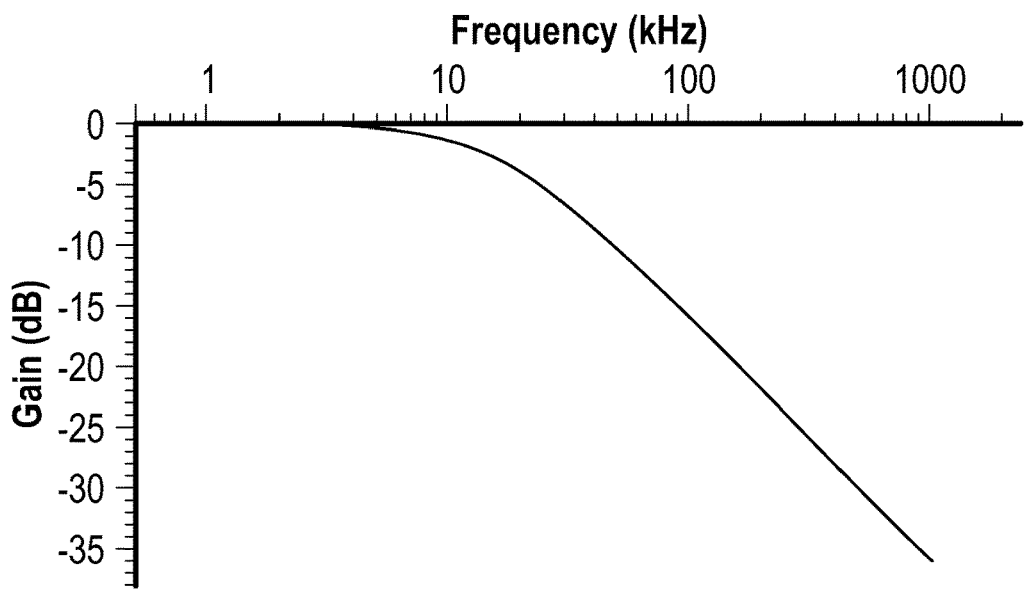
FIG. 10 shows a frequency response of the filter circuit of FIG. 9, with R=10 k ohm and C=1 nF.

Thus the frequency where the output is reduced by 3 db is $1/2\pi RC$. A graph of the frequency response is shown in FIG. 10. In particular, FIG. 10 shows the frequency response of the RC circuit shown in FIG. 9. R=10 k ohm, C=1 nF. The horizontal axis of FIG. 10 is the frequency of in kHz, and the vertical axis of FIG. 10 is the gain in dB. It is evident that the output is reduced significantly at frequency higher than 50 kHz. ($1/2\pi RC$=16 kHz).

It may be desirable to connect the output of such filter to a buffer circuit (such as an OPAMP) to boost the current output and reduce the sensitivity to the impedance of the next stage.

Figure 11:
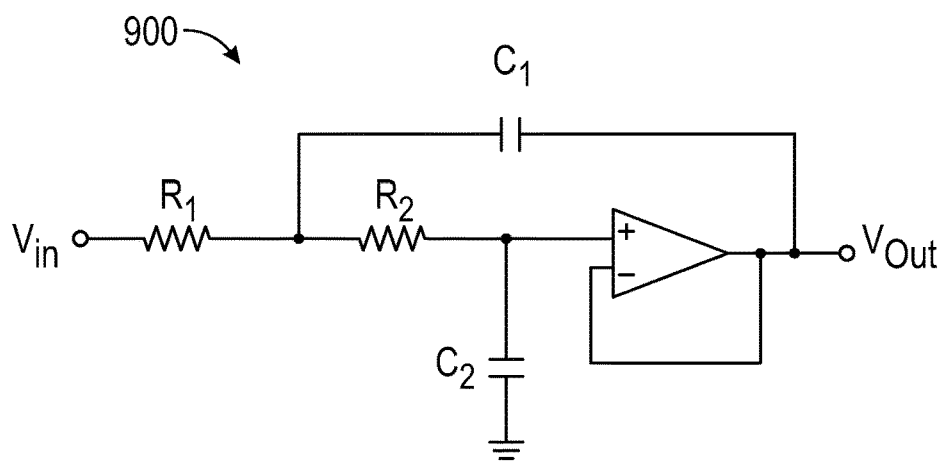
FIG. 11 shows a Sallen-Key low-pass filter of unit-gain.

Other filter topologies can be used. For example, a Sallen-Key low-pass filter uses an active component (OPAMP or instrument AMP) to improve the frequency response. For example, FIG. 11 shows a Sallen-Key low-pass filter 900 of unit-gain.

The filter type is the 2nd-order Sallen-key low-pass filter whose transfer function is expressed as below.

$$H(s) = \frac{1}{1 + s(R_1 + R_2)C_2 + s^2 R_1 R_2 C_1 C_2}$$

The cut-off frequency of the filter is $$f_0 = \frac{1}{2\pi \sqrt{R_1 R_2 C_1 C_2}}$$

If $R_1=R_2=R$ and $C_1=C_2=C$, the frequency becomes:

$$f_0 = \frac{1}{2\pi RC}$$

For 50 kHz of cut-off frequency, C=1 nF and R=3.18 k ohms.

PFG Amplitude Control

The amplitude of the PFG signal is to be modulated/controlled for a diffusion experiment. However, at least some of the RF ASIC designed for NMR do not have the ability to vary the amplitude of the RF pulses.

The Pulse-width modulation (PWM) method may be applied to produce amplitude varying PFG pulses using the fixed amplitude RF pulses. With the use of a low-pass filter at the output of the rectifier, only low frequency signal is passed through which is similar to an integral of the signal. For example, if there is a series of 200 1-µs long pulses with 1-µs time between them, the total length of the sequence will be 400 µs long. The average output will be ½ of the signal with a 400-µs long pulse.

Broadly speaking, this method is called Pulse-Width Modulation (PWM) that uses a rectangular pulse wave whose pulse duty cycle is modulated resulting in the variation of the average value of the waveform. If we consider a pulse waveform, with low value 0, a high value $Y_{MAX}$ and a duty cycle D, the average value of the waveform is given by:

$$Y_{AVG} = D \times Y_{MAX}$$

Figure 12A:
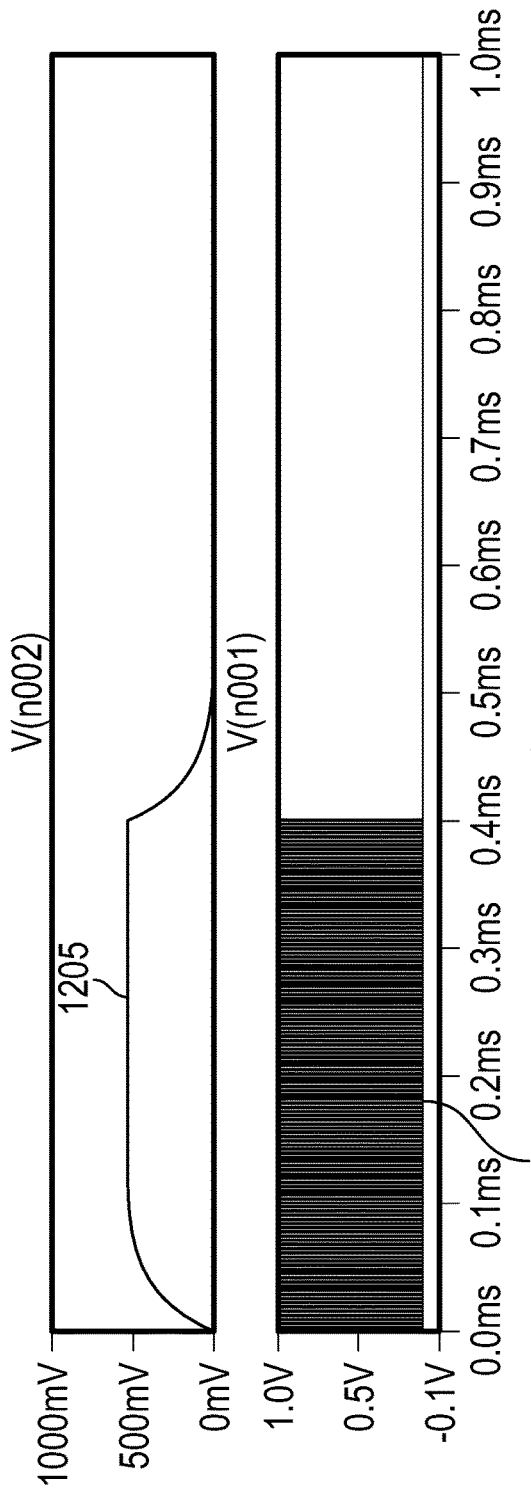
FIGS. 12A and 12B show simulation results of a PWM circuit.
Figure 12B:
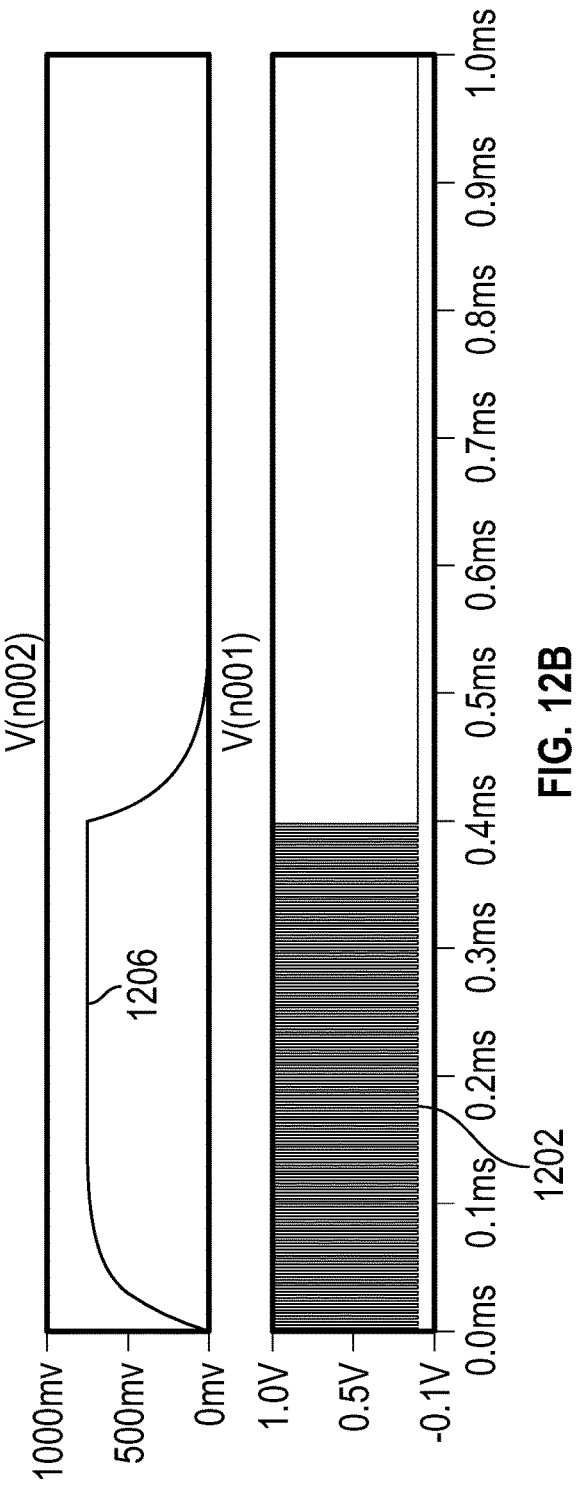

Referring to FIGS. 12A and 12B, a simulation of the circuit shows curves 1201 and 1202 that correspond to input pulses, 1 µs on and 1 µs off. Curves 1205 and 1206 correspond to the output signal after the filter.

FIG. 12A corresponds to a 50% duty cycle, and FIG. 12B corresponds to a 75% duty cycle resulting in a higher output voltage, demonstrating the PWM method.

There are many ways to implement the PWM concept, such as Delta modulation, Delta-sigma modulation, time proportioning, etc.

All of these methods utilize accurate timing of the pulses and it can be readily supplied by the NMR ASIC.

PFG Test Results

Figure 13:
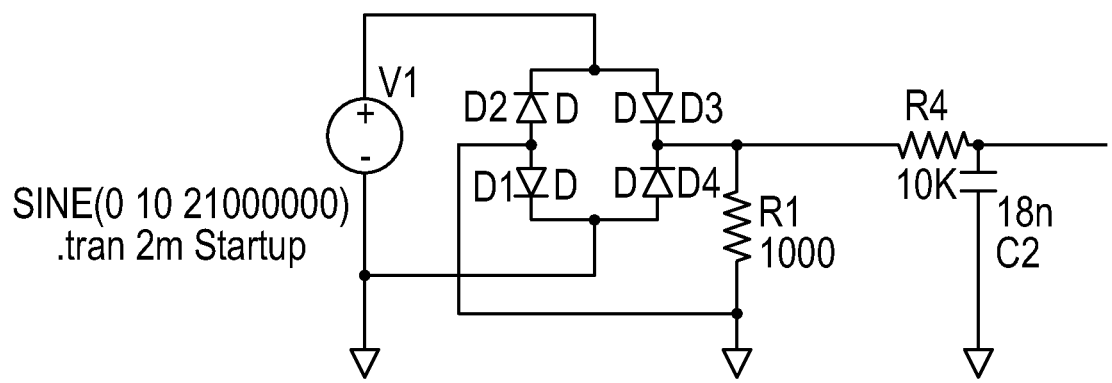
FIG. 13 shows a circuit diagram for generating DC pulses from RF pulses.

One of the PWM circuits tested is shown in FIG. 13, which is a circuit diagram for generating DC pulse from RF pulse. A full-bridge rectifier is followed by a low-pass filter. RC time equals 180 µs. The ASIC probe + and − are fed into V1. The DC output is measured after R4.

Figure 14:
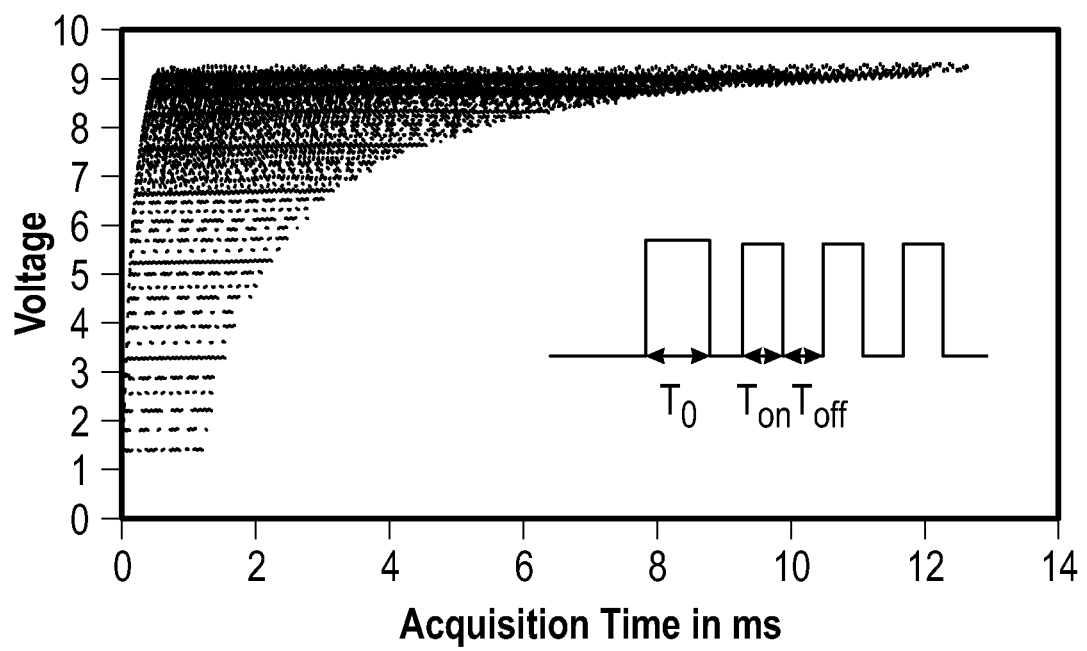
FIG. 14 shows a simulation of DC amplitude as a function of acquisition time in milliseconds, with an inset showing the RF pulses and tuning parameters to obtain a desired DC amplitude.

To obtain the desired DC amplitude, the first pulse length is set to be $T_0$, as shown in FIG. 14. DC amplitude after the pulse is $V=V_0(1-e^{-T_0/RC})$. The voltage amplitude V is maintained by tuning the ratio $T_{on}/T_{off}$, where $T_{on}$ and $T_{off}$ are the duration of subsequent pulses and interval in between. It can be shown that under the limit $T_{on}, T_{off} \ll RC$, V sustains when the relation $T_{on}=T_{off} \times V/(V_0-V)$ holds. FIG. 14 is the simulation result on output DC amplitude as a function of acquisition time in milliseconds, given the proper combination of $T_0$, $T_{on}$ and $T_{off}$. The inset portion of FIG. 14 shows the RF pulses and tuning parameters to obtain a desired DC amplitude. It becomes evident that a wide range of DC amplitudes can be achieved and maintained by a prudent selection of $T_0$, $T_{on}$, and $T_{off}$.

Figure 15A:
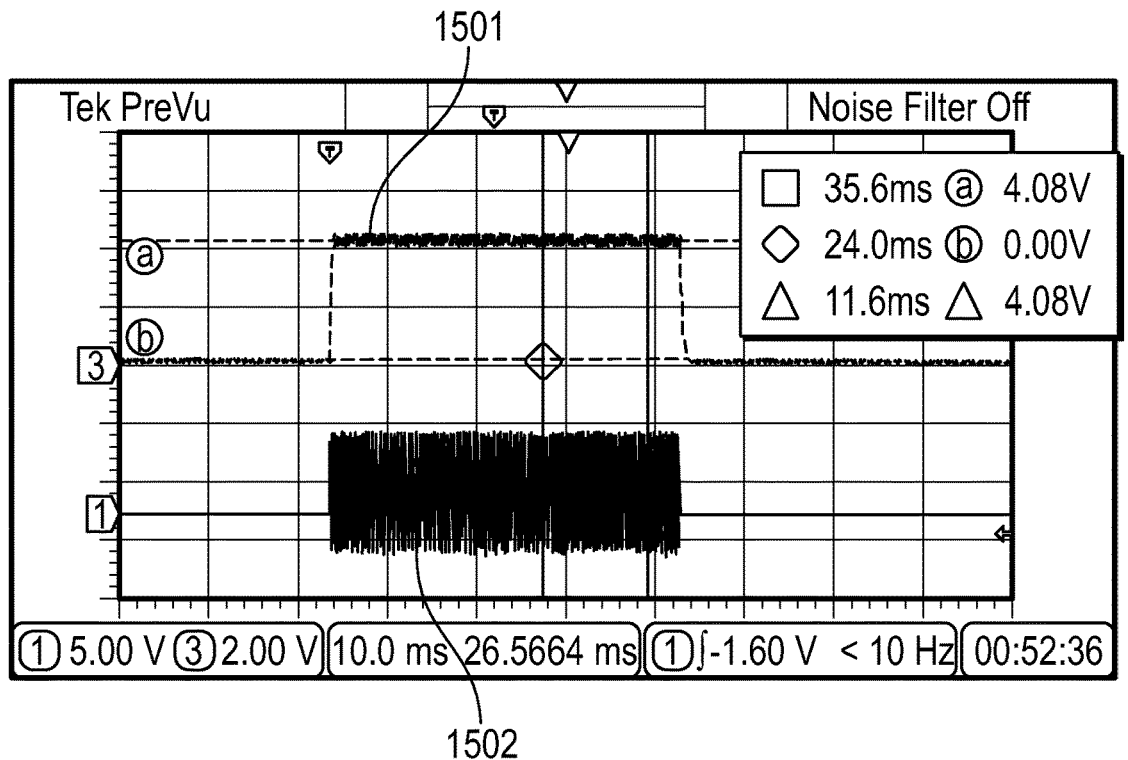
FIGS. 15A and 15B show an output signal and RF pulses.
Figure 15B:
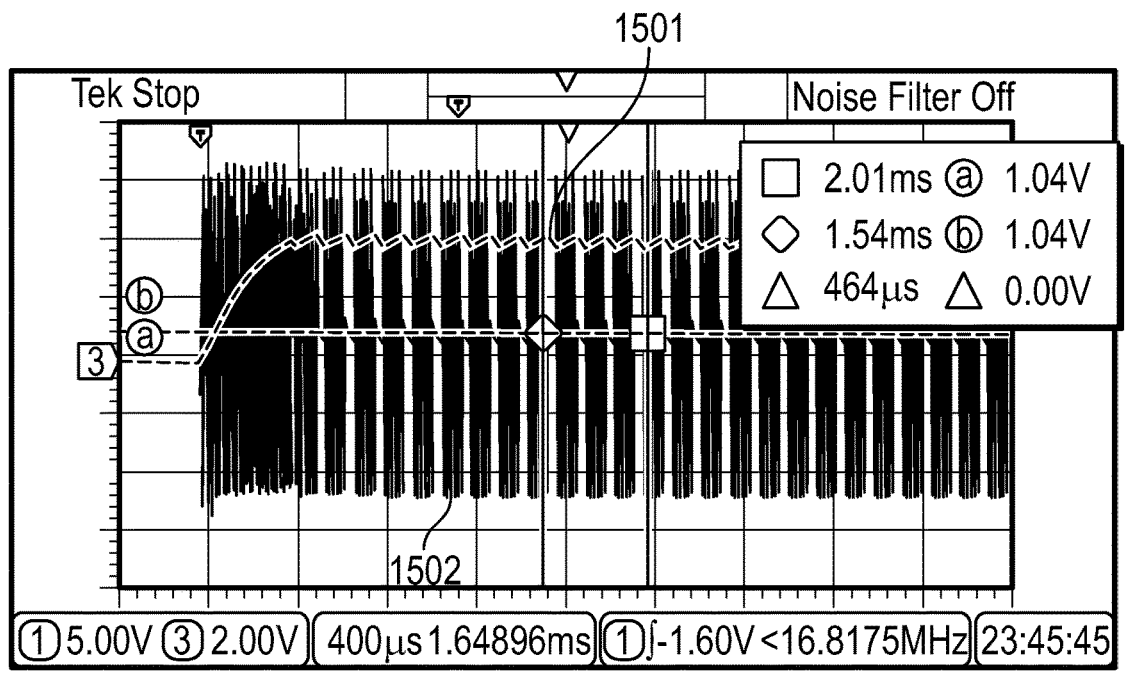
Figure 16:
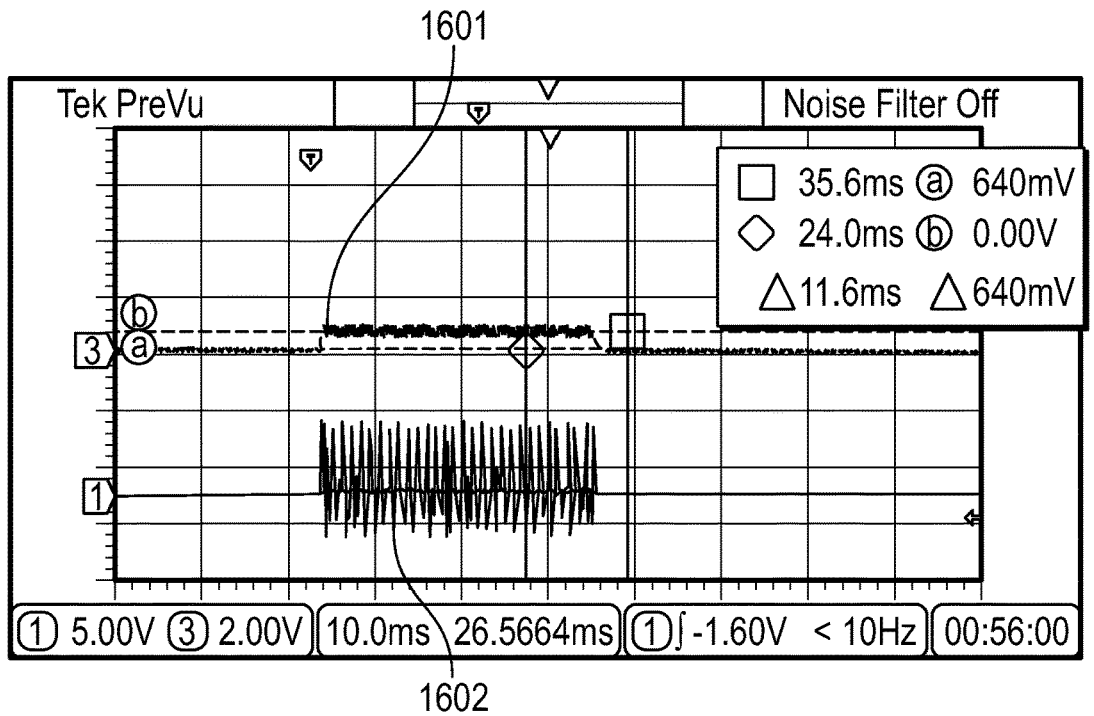
FIG. 16 shows an output signal and RF pulses.

FIGS. 15A, 15B, and 16 show testing results on the circuit with different sets of parameters. They are snapshots of ASIC RF pulses and DC output on an oscilloscope. Indeed a wide range of DC amplitudes was achieved.

FIG. 15A shows output signal 1501 with $T_0$=350 μs, $T_{on}$=120 πs, $T_{off}$=30 μs, and the RF pulses 1502. DC amplitude is stabilized 4.08 V. FIG. 15B shows a zoomed-in view of the first 25 RF pulses 1502 and corresponding output DC voltage 1501.

FIG. 16 shows Output signal 1601 with $T_0$=20 μs, $T_{on}$=5 μs, $T_{off}$=30 μs, and the RF pulses 1602. DC amplitude is stabilized at 0.64 V.

PFG Circuit—Current Driver

The goal of the PFG circuit is to control static magnetic field gradients, which are proportional to currents flowing through one or more gradient coils. However, analog signal processing, both in ASICs and in board-level designs, is usually performed using voltages, not currents. As a result, PFG circuits often use a series resistor to convert the coil current into a proportional voltage drop. A voltage-based negative feedback loop is then used to regulate the coil current to its desired value. This loop must be designed properly in order to remain stable and well-behaved over all possible changes in coil inductance, operating temperature, output current level, and other system parameters. Fortunately, sensing and regulating the load current (instead of the load voltage) simplifies the dynamics of the system by eliminating the load impedance from the feedback loop. The same characteristic underlies the recent popularity of current-mode control for DC/DC converters.

In accordance with example implementations, there are two main circuit topologies used for current sensing: low-side, in which one end of the sensing resistor is connected to a known voltage (such as a DC power supply or ground), and high-side, in which both ends of the resistor can float. For maximum flexibility, we decided to use separate sense resistors and feedback loops for positive and negative output currents. Low-side sense resistors in such dual-loop designs should not be referenced to ground, because it is common to both current paths. They can instead be referenced to the corresponding supply voltages ($V_{SS}$ and $V_{DD}$), but only if these voltages remain completely stable during the pulse, i.e., exhibit no droop. In other words, the corresponding DC voltage regulators must be designed to continuously supply the maximum output current. In reality, however, the output has very low duty cycle and is only needed in short bursts, which means that the low-side scheme is very inefficient.

Some examples therefore use a high-side sensing scheme. Here each sense resistor $R_{sense}$ is placed in series with its corresponding regulated current source (e.g., a MOSFET), cuch as the example shown in FIG. 3. As a result, the sensed voltages are largely independent of VSS and $V_{DD}$, as long as they are large enough to keep the MOSFETs saturated. In other words, these voltages can drop by considerable amounts during pulses without affecting the output current. Hence voltage regulators with relatively small output current capabilities can be used to generate $V_{SS}$ and $V_{DD}$, as long as enough capacitance is present at their outputs. These capacitors are discharged during high-current pulses, and later recharged by the regulators.

FIG. 3 shows a simplified schematic of the gradient driver circuit. The differential amplifiers, integrators, and voltage read-back amplifiers are implemented using op-amps. The input voltages $v_{IN,P}$ and $v_{IN,N}$ are generated by digital-to-analog converters (DACs).

A differential amplifier (voltage gain=$k_1$) may be used to sense and amplify the voltage across each resistor. The amplified voltage is then compared with the desired value ($v_{IN,P}$ or $v_{IN,N}$), integrated, low-pass filtered, and finally fed back into the gate terminal of the MOSFET to complete the feedback loop. As a result, the coil current in steady state is directly proportional to the corresponding input voltage, and is given by $i_L(t)=v_{IN}(t)/(k_1 R_{sense})$. The purpose of the low-pass filter is to reduce the loop bandwidth so that it remains stable with large inductive loads. Finally, the output of the differential amplifier is further amplified (voltage gain=$k_2$). This "read back" voltage $v_{OUT}(t)=(k_1 k_2 R_{sense})i_L(t)$ is directly proportional to the coil current $i_L(t)$, and can be used for monitoring and recording the coil current. The conversion factor (transimpedance) between these two variables is simply ($k_1 k_2 R_{sense}$).

Use of RF ASIC for Trigger Pulses

As discussed earlier, some NMR experiments require electronic triggers at specific time of the experiment in order to activate/synchronize with other equipment. These triggers are typically logic pulses, such as DC pulses of a few volts, for example, TTL pulses (0 to 5 V). The timing of these pulses (the time of their execution and the duration of them) is important for the proper synchronization of equipment. Similar to the conversion of RF pulses for PFG, rectification of RF pulses can be used to generate trigger pulses too.

Trigger pulses are often short, such as a few microseconds. As a result, the low-pass filter associated with the circuit would be required to be of broader bandwidth. For example, in order to properly execute trigger pulses of 1 μs, bandwidth of larger than 1 MHz would be needed. Thus the component selection for the low pass filter will be different for PFG.

Overall System Configuration

Figure 17:
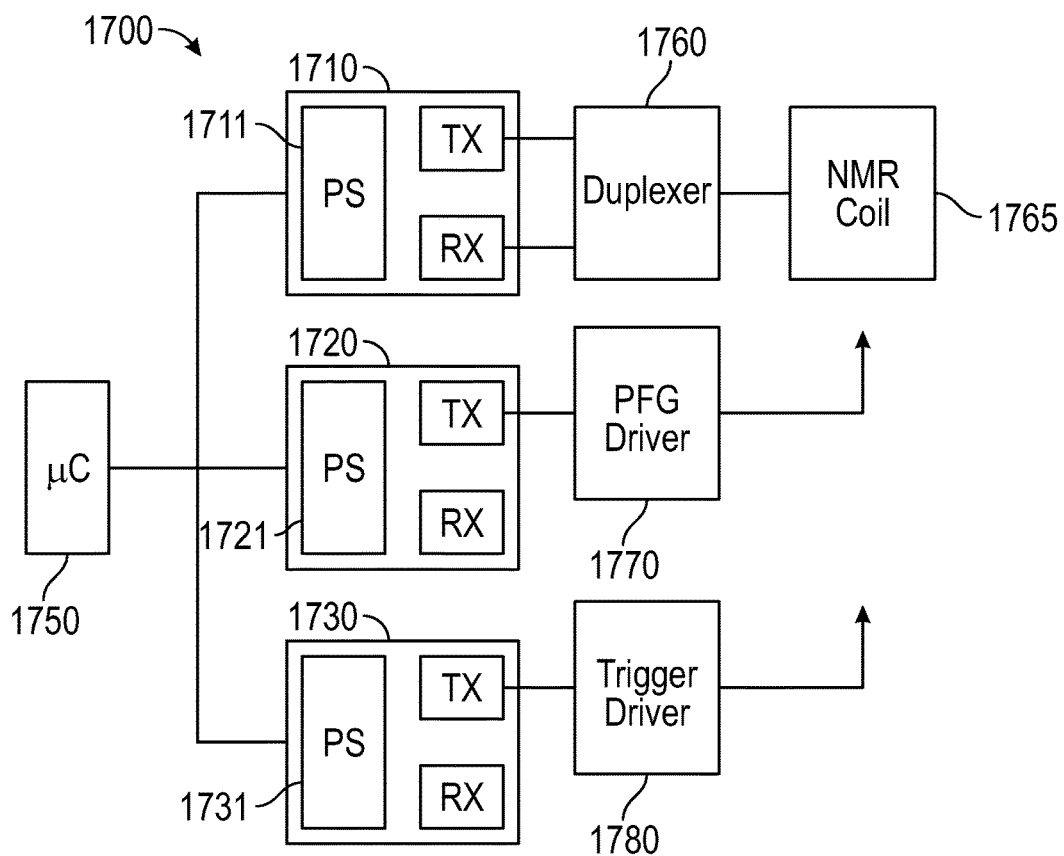
FIG. 17 shows an overall system configuration.

For some applications, an ideal NMR ASIC would have implemented the PFG, and triggers internally (on-chip). However, development of ASIC for a given application may be costly and time-consuming, and there are scenarios where using the existing ASIC is beneficial and cost effective. For such cases, referring to FIG. 17, a system 1700 may include multiple RF ASICs 1710, 1720, and 1730, all connected to the micro-Controller (μC) 1750. The μC 1750 will program all the ASICs 1710, 1720, and 1730 according to the desired pulse sequences which include the operation of PFG unit and external triggers. In fact, the PFG unit will have a sequence that is different from that of the RF ASIC, however, their operations are all synchronized by the pulse sequencer 1711, 1721, 1731 imbedded in each unit. The signal to begin the execution of all the pulse sequences can be initiated from the μC 1750 so that all units 1710, 1720, and 1730 will operate in sync. FIG. 17 provides the schematic of overall system configuration. In the system of FIG. 17, non-PFG capable NMR ASIC chips 1710, 1720, and 1730 are integrated into a system that allows PFG capability and trigger functionality in addition to NMR transmission (TX) and receipt (RX) signals. In the illustrated example, the system includes three RF-only (non-PFG capable) NMR ASIC chips 1710, 1720, and 1730, although it should be understood that other examples may provide more or less than three NMR ASIC chips. The first RF-only NMR ASIC chip 1710 is coupled via a duplexer 1760 with the NMR coil 1765 for transmission of TX and RX signals. The second RF-only NMR ASIC chip 1720 is coupled to a PFG driver 1770 to convert the RF signals of the second RF-only NMR ASIC chip 1720 to a pulse field gradient. The third RF-only NMR ASIC chip 1730 is coupled to a trigger driver 1780 to convert RF signals of the third RF-only NMR ASIC chip 1730 to trigger signals. Coordination of the functions provided by the three chips and related components is handled by a processor such as the microcontroller (μC) 1750.

Although example NMR ASICs include many features and capabilities, the circuit implementations of these features may be conventional and well-known in the art of electronic engineering and ASIC design. For example, the expanded memory for the sequencer and configuration memory can use conventional SRAM design techniques (e.g. memory cells with 6 or 4 transistors). There are also many methods to implement such features. For example, many different topologies are available for the implementation of ADCs, such as direct conversion, successive approximation, sigma-delta, etc. Also, certain applications may require high temperature operation, such as well-logging. The detailed design and manufacturing processes for such high temperature chips may be different from normal (low temperature) chips. For example, silicon-on-insulator (SOI) processes can be used to reduce on-chip leakage currents, which may prevent operation at high temperatures.

In some embodiments, the controller is located within a borehole tool and configured to operate in high-temperature and high-pressure conditions.

Although illustrated example embodiments described herein refer to an ASIC, it should be understood that other implementations may take other forms. For example, some implementations may utilize non-application-specific integrated circuits.

Illustrative embodiments of the present disclosure are not limited to wireline logging operations. For example, the embodiments described herein can also be used with any suitable means of conveyance, such as coiled tubing. Furthermore, various embodiments of the present disclosure may also be applied in logging-while-drilling (LWD) operations, sampling-while-drilling operations, measuring-while-drilling operations, or any other operation where sampling of the formation is performed.

Furthermore, various embodiments of the present disclosure are not limited to oil and gas field applications. The methods and systems described herein can also be applied to, for example, petrochemical refining and chemical manufacturing.

Although several example embodiments have been described in detail above, those skilled in the art will readily appreciate that many modifications are possible in the example embodiments without materially departing from the scope of this disclosure. Moreover the features described herein may be provided in any combination. Accordingly, all such modifications are intended to be included within the scope of this disclosure.

What is claimed is:

1. An NMR application-specific integrated circuit chip, comprising:
    an on-chip pulse sequence generator included as part of the NMR application-specific integrated circuit chip and configured to generate NMR pulse sequences;
    an on-chip transmitter included as part of the NMR application-specific integrated circuit chip and configured to transmit the NMR pulse sequences generated by the on-chip pulse sequence generator;
    an on-chip receiver included as part of the NMR application-specific integrated circuit chip and configured to receive signals corresponding to an excitation period of the NMR pulse sequences generated by the on-chip pulse sequence generator;
    an on-chip pulse field gradient unit included as part of the NMR application-specific integrated circuit chip and configured to generate pulses defining a pulse field gradient;
    at least one of (a) an on-chip external trigger included as part of the NMR application-specific integrated circuit chip and configured to provide trigger signals that can be sent to an external device and (b) an on-chip external input included as part of the NMR application-specific integrated circuit chip and configured to receive input from a device external to the NMR application-specific integrated circuit chip; and
    an on-chip configuration memory included as part of the NMR application-specific integrated circuit chip and configured to store values of the configuration of the NMR application-specific integrated circuit chip.

2. The NMR application-specific integrated circuit chip of claim 1, wherein the on-chip configuration memory includes a loop counter variable, the application-specific integrated circuit being configured to terminate a pulse sequence based on a value of the loop counter variable.

3. The NMR application-specific integrated circuit chip of claim 1, further comprising an on-chip analog-to-digital converter included as part of the NMR application-specific integrated circuit chip.

4. The NMR application-specific integrated circuit chip of claim 1, further comprising an on-chip frequency synthesizer included as part of the NMR application-specific integrated circuit chip.

5. The NMR application-specific integrated circuit chip of claim 1, wherein the NMR application-specific integrated circuit is part of a wellbore logging tool.

6. A method comprising:
    performing an NMR analysis using the NMR application-specific integrated circuit chip of claim 1.

7. The method according to claim 6, further comprising applying the pulse field gradient during the NMR analysis, the pulse field gradient being controlled via the on-chip pulse field gradient unit.

8. The method according to claim 7, wherein the method is performed downhole in a wellbore.

9. The NMR application-specific integrated circuit chip of claim 1, wherein the on-chip pulse field gradient unit included as part of the NMR application-specific integrated circuit chip employs pulse width modulation of a fixed frequency RF pulse to produce a variable amplitude direct-current PFG signal.

10. An NMR system comprising:
    a radio frequency (RF) NMR application-specific integrated circuit (ASIC) chip configured to generate an RF output signal; and
    a rectifier and low-pass filter configured to receive the RF output signal and convert the RF output signal to (a) a direct current (DC) pulsed field gradient (PFG) signal or (b) a DC trigger signal for at least one of (i) activating at least one component of an NMR system external to the RF NMR ASIC chip and (ii) synchronizing at least one component of an NMR system external to the RF NMR ASIC chip, wherein the RF NMR ASIC chip includes a current-mode driver circuit that measures both a current level and voltage level of the DC PFG signal, wherein the current-mode driver circuit includes at least one differential amplifier circuit with two inputs across a sense resistor in order to measure the current level of the DC PFG signal.

11. The NMR system of claim 10, wherein the rectifier is included as part of the RF NMR ASIC chip.

12. The NMR system of claim 10, wherein the RF NMR ASIC chip employs pulse width modulation of a fixed frequency RF pulse such that the rectifier and low-pass filter produce a variable amplitude DC PFG signal.

13. The NMR system of claim 10, wherein the current-mode driver circuit further includes at least one integrator circuit with one input coupled to a voltage reference and another input coupled to the output of the differential circuit amplifier circuit in order to measure the voltage level of the DC PFG signal.

14. The NMR system of claim 13, wherein the current-mode driver circuit further includes a MOSFET having a gate terminal and a source-drain current path coupled to the sense resistor, wherein output of the integrator circuit is supplied to the gate terminal of MOSFET.

* * * * *